(12) United States Patent
Kobayashi et al.

(10) Patent No.: US 10,672,834 B2
(45) Date of Patent: Jun. 2, 2020

(54) SEMICONDUCTOR MEMORY DEVICE

(71) Applicant: Toshiba Memory Corporation, Minato-ku (JP)

(72) Inventors: Yusuke Kobayashi, Kuwana (JP); Yoshihisa Iwata, Yokohama (JP); Takeshi Sugimoto, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/282,482

(22) Filed: Feb. 22, 2019

(65) Prior Publication Data

US 2019/0189693 A1 Jun. 20, 2019

Related U.S. Application Data

(63) Continuation of application No. 15/899,465, filed on Feb. 20, 2018, now Pat. No. 10,256,274, which is a continuation of application No. 15/384,501, filed on Dec. 20, 2016, now Pat. No. 9,929,212, which is a continuation of application No. 15/069,378, filed on Mar. 14, 2016, now Pat. No. 9,553,132.

(60) Provisional application No. 62/216,176, filed on Sep. 9, 2015.

(51) Int. Cl.
*H01L 27/24* (2006.01)
*H01L 23/528* (2006.01)

(52) U.S. Cl.
CPC ...... *H01L 27/2481* (2013.01); *H01L 23/528* (2013.01); *H01L 27/2436* (2013.01)

(58) Field of Classification Search
CPC .................................................. H01L 23/528
See application file for complete search history.

(56) References Cited

U.S. PATENT DOCUMENTS

| | | | |
|---|---|---|---|
| 5,742,086 A | 4/1998 | Rostoker |
| 5,789,770 A | 8/1998 | Rostoker |
| 6,407,434 B1 | 6/2002 | Rostoker |
| 7,291,878 B2 | 11/2007 | Stipe et al. |
| 7,663,900 B2 | 2/2010 | Stipe et al. |
| 7,982,504 B1 | 7/2011 | Robinett |
| 8,097,903 B2 | 1/2012 | Inaba et al. |
| 8,178,909 B2 | 5/2012 | Venkatraman |
| 8,354,340 B2 | 1/2013 | Kurita |
| 9,379,164 B2 | 6/2016 | Nakai |

(Continued)

*Primary Examiner* — Thao P Le
(74) *Attorney, Agent, or Firm* — Oblon, McClelland, Maier & Neustadt, L.L.P.

(57) ABSTRACT

According to the embodiment, a semiconductor memory device includes a first conductive layer, a second conductive layer, a first memory cell, a second memory cell, a third conductive layer, a first contact, a intermediate memory cell, a fourth conductive layer, a third memory cell, a fifth conductive layer, and a second contact. The third conductive layer is separated from the first conductive layer and the second conductive layer in a third direction crossing a first direction and crossing a second direction and extends in the second direction. The fifth conductive layer is separated from the second conductive layer in the third direction and extends in the second direction. A first length of the second conductive layer along the second direction is shorter than a second length of the fifth conductive layer along the second direction.

38 Claims, 6 Drawing Sheets

(56) References Cited

U.S. PATENT DOCUMENTS

| | | | |
|---|---|---|---|
| 2006/0120205 A1* | 6/2006 | Odagawa | G11C 11/5685 |
| | | | 365/232 |
| 2007/0133358 A1* | 6/2007 | Kubo | B82Y 10/00 |
| | | | 369/13.38 |
| 2009/0168481 A1 | 7/2009 | Stipe | |
| 2010/0070942 A1 | 3/2010 | Madurawe | |
| 2010/0176368 A1 | 7/2010 | Ko | |
| 2010/0264393 A1 | 10/2010 | Mikawa | |
| 2011/0095434 A1 | 4/2011 | Scheuerlein | |
| 2011/0193049 A1* | 8/2011 | Iwakaji | H01L 27/1021 |
| | | | 257/4 |
| 2011/0227019 A1 | 9/2011 | Kuniya | |
| 2012/0018695 A1* | 1/2012 | Lee | G11C 13/0004 |
| | | | 257/4 |
| 2013/0010520 A1* | 1/2013 | Murooka | H01L 45/04 |
| | | | 365/148 |
| 2013/0069029 A1 | 3/2013 | Kuniya | |
| 2013/0161582 A1* | 6/2013 | Arayashiki | H01L 45/085 |
| | | | 257/4 |
| 2014/0061567 A1 | 3/2014 | Kobayashi | |
| 2014/0246643 A1* | 9/2014 | Kim | H01L 27/2481 |
| | | | 257/4 |
| 2014/0284535 A1* | 9/2014 | Saitoh | H01L 27/2436 |
| | | | 257/2 |
| 2014/0306174 A1* | 10/2014 | Murooka | H01L 27/249 |
| | | | 257/5 |
| 2015/0262896 A1 | 9/2015 | Yamanaka | |
| 2016/0268503 A1 | 9/2016 | Suzuki | |
| 2016/0276412 A1 | 9/2016 | Koyama | |
| 2017/0062713 A1 | 3/2017 | Takagi | |
| 2019/0259811 A1* | 8/2019 | Terada | G11C 29/80 |

\* cited by examiner

SEMICONDUCTOR MEMORY DEVICE

CROSS-REFERENCE TO RELATED APPLICATIONS

This application is a continuation of and claims the benefit of priority from U.S. Ser. No. 15/899,465, filed Feb. 20, 2018, which is a continuation of U.S. Ser. No. 15/384,501, filed Dec. 20, 2016, which is a continuation of U.S. Ser. No. 15/069,378 filed Mar. 14, 2016, and claims the benefit of priority of U.S. Provisional Patent Application 62/216,176 filed Sep. 9, 2015; the entire contents of each of which are incorporated herein by reference.

FIELD

An embodiment relates to a semiconductor memory device.

BACKGROUND

A cross-point semiconductor memory device in which two conductive layers and a resistance-change layer provided between the layers are provided has been proposed.

DETAILED DESCRIPTION

Figure 1A:
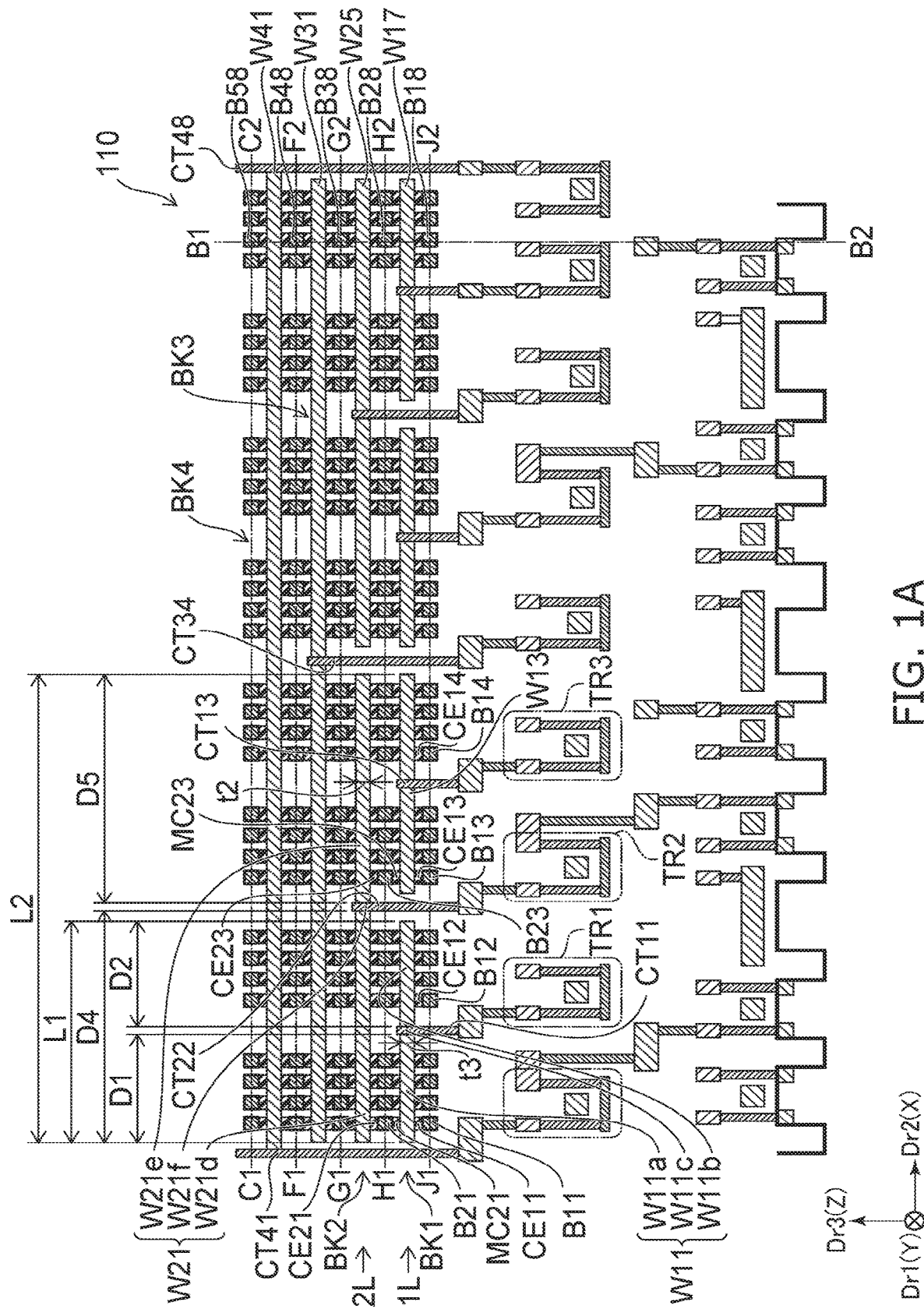
FIG. 1A and FIG. 1B are schematic sectional views illustrating a semiconductor memory device according to an embodiment.

According to one embodiment, a semiconductor memory device includes a first-layer first-row first conductive layer, a first-layer second-row first conductive layer, a first-layer first-row memory cell, a first-layer second-row memory cell, a first-layer first-row second conductive layer, a first-layer first-row contact, a second-layer first-row intermediate memory cell, a second-layer first-row first conductive layer, a second-layer first-row memory cell, a second-layer first-row second conductive layer, and a second-layer second-row contact. The first-layer first-row first conductive layer extends in a first direction. The first-layer second-row first conductive layer is separated from the first-layer first-row first conductive layer in a second direction crossing the first direction and extends in the first direction. The first-layer first-row second conductive layer is separated from the first-layer first-row first conductive layer and the first-layer second-row first conductive layer in a third direction crossing the first direction and crossing the second direction and extends in the second direction. The first-layer first-row memory cell is provided between the first-layer first-row second conductive layer and the first-layer first-row first conductive layer. The first-layer second-row memory cell is provided between the first-layer first-row second conductive layer and the first-layer second-row first conductive layer. The first-layer first-row contact is connected to the first-layer first-row second conductive layer. The first-layer first-row contact extends in the third direction between the first-layer first-row first conductive layer and the first-layer second-row first conductive layer. The second-layer first-row second conductive layer is separated from the first-layer first-row second conductive layer in the third direction and extends in the second direction. The second-layer first-row second conductive layer the first-layer first-row second conductive layer is disposed between the second-layer first-row second conductive layer and the first-layer first-row memory cell and between the second-layer first-row second conductive layer and the first-layer second-row memory cell in the third direction. The second-layer first-row intermediate memory cell is provided between the first-layer first-row second conductive layer and the second-layer first-row second conductive layer. The second-layer first-row first conductive layer is provided between the second-layer first-row intermediate memory cell and the second-layer first-row second conductive layer and extends in the first direction. The second-layer first-row memory cell is provided between the second-layer first-row first conductive layer and the second-layer first-row second conductive layer. The second-layer second-row contact is connected to the second-layer first-row second conductive layer. The second-layer second-row contact is separated from the first-layer first-row contact in the second direction and extends in the third direction. The first-layer second-row first conductive layer and the first-layer second-row memory cell are disposed between the second-layer second-row contact and the first-layer first-row contact in the second direction. A first length of the first-layer first-row second conductive layer along the second direction is shorter than a second length of the second-layer first-row second conductive layer along the second direction.

Embodiments of the invention will be described hereinafter with reference to the drawings.

The drawings are schematic and conceptual, and the relationships between the thickness and width of portions, the size ratio among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with like reference numerals, and the detailed description thereof is omitted as appropriate.

Embodiment

Figure 1B:
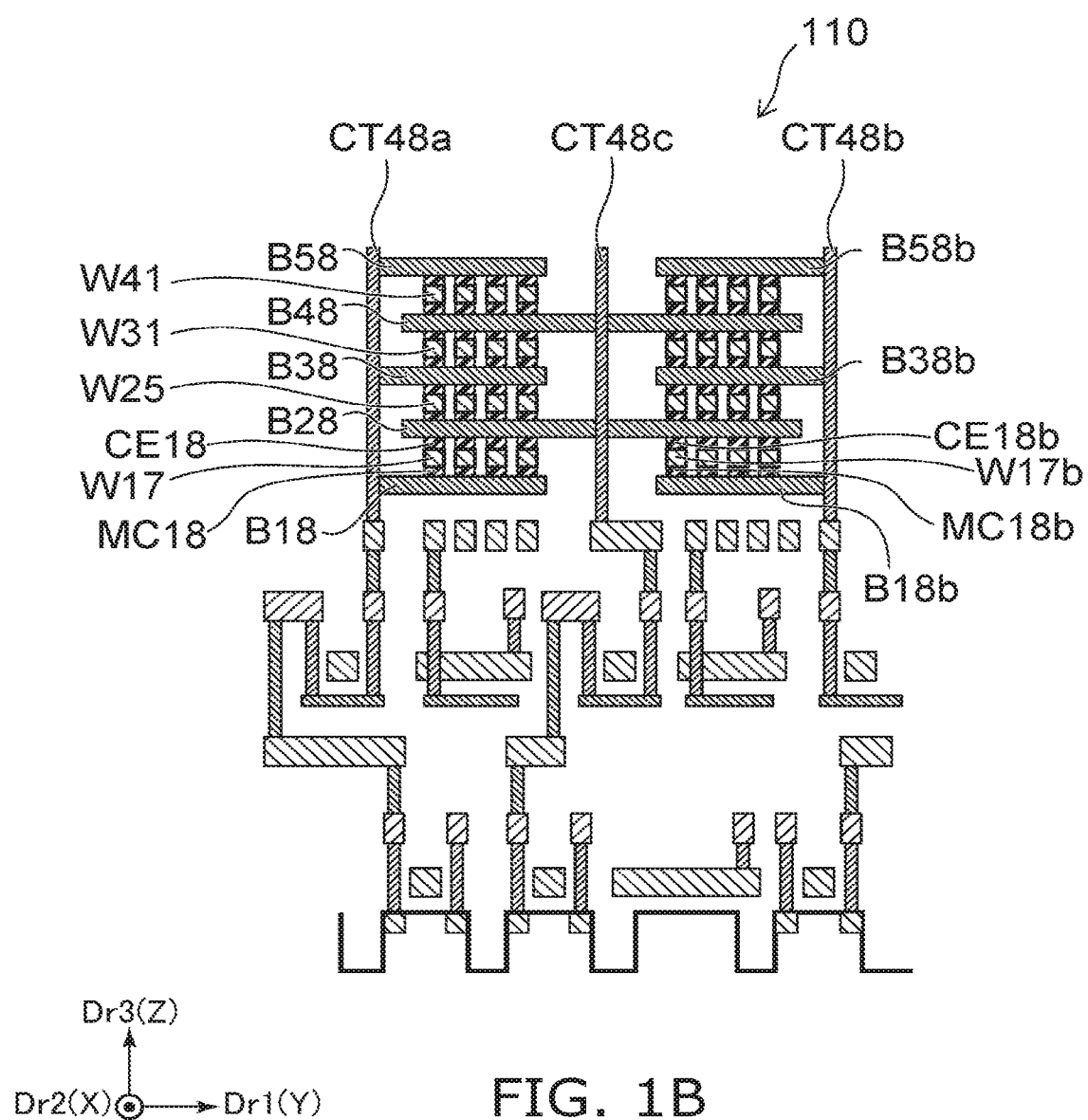

FIG. 1A and FIG. 1B are schematic sectional views illustrating a semiconductor memory device according to an embodiment.

FIG. 1B is the schematic sectional view along line B1-B2 in FIG. 1A.

As shown in FIG. 1A and FIG. 1B, a semiconductor memory device 110 according to the embodiment includes a first block BK1 (first layer block), a second block BK2

(second layer block), a third block BK3 (third layer block) and a fourth block BK4 (fourth layer block). These blocks each includes a conductive layer and a memory cell. The conductive layer and the memory cell of the second block BK2 are provided on the first block BK1. The conductive layer and the memory cell of the third block BK3 are provided on the conductive layer and the memory cell of the second block BK2. The conductive layer and the memory cell of the fourth block BK4 are provided on the conductive layer and the memory cell of the third block BK3. Contacts extending in the vertical directions are provided on each of the blocks.

As below, the first block BK1 and the second block BK2 will be described.

The semiconductor memory device 110 includes a first-layer first-row first conductive layer B11, a first-layer second-row first conductive layer B12, a first-layer first-row memory cell CE11, a first-layer second-row memory cell CE12, a first-layer first-row second conductive layer W11, a first-layer first-row contact CT11, a second-layer first-row intermediate memory cell MC21, a second-layer first-row first conductive layer B21, a second-layer first-row memory cell CE21, a second-layer first-row second conductive layer W21, and a second-layer second-row contact CT22.

The first-layer first-row first conductive layer B11 extends in a first direction Dr1. The first-layer second-row first conductive layer B12 is separated from the first-layer first-row first conductive layer B11 in a second direction Dr2 crossing the first direction Dr1 and extends in the first direction Dr1.

The first-layer first-row second conductive layer W11 is separately provided from the first-layer first-row first conductive layer B11 and the first-layer second-row first conductive layer B12 in a third direction Dr3 crossing the first direction Dr1 and crossing the second direction Dr2. The first-layer first-row second conductive layer W11 extends in the second direction Dr2.

The first direction Dr1 is e.g. the Y-direction. The second direction Dr2 is e.g. the X-direction. The third direction Dr3 is e.g. the Z-direction.

The first-layer first-row memory cell CE11 is provided between the first-layer first-row second conductive layer W11 and the first-layer first-row first conductive layer B11. The first-layer second-row memory cell CE12 is provided between the first-layer first-row second conductive layer W11 and the first-layer second-row first conductive layer B12.

The first-layer first-row contact CT11 is connected to the first-layer first-row second conductive layer W11. The first-layer first-row contact CT11 extends in the third direction Dr3 between the first-layer first-row first conductive layer B11 and the first-layer second-row first conductive layer B12.

The second-layer first-row second conductive layer W21 is separated from the first-layer first-row second conductive layer W11 in the third direction Dr3 and extends in the second direction Dr2. The first-layer first-row second conductive layer W11 is disposed between the second-layer first-row second conductive layer W21 and the first-layer first-row memory cell CE11 and between the second-layer first-row second conductive layer W21 and the first-layer second-row memory cell CE12 in the third direction Dr3.

The second-layer first-row intermediate memory cell MC21 is provided between the first-layer first-row second conductive layer W11 and the second-layer first-row second conductive layer W21.

The second-layer first-row first conductive layer B21 is provided between the second-layer first-row intermediate memory cell MC21 and the second-layer first-row second conductive layer W21 and extends in the first direction Dr1.

The second-layer first-row memory cell CE21 is provided between the second-layer first-row first conductive layer B21 and the second-layer first-row second conductive layer W21.

The second-layer second-row contact CT22 is connected to the second-layer first-row second conductive layer W21. The second-layer second-row contact CT22 is separated from the first-layer first-row contact CT11 in the second direction Dr2 and extends in the third direction Dr3.

The first-layer second-row first conductive layer B12 and the first-layer second-row memory cell CE12 are disposed between the second-layer second-row contact CT22 and the first-layer first-row contact CT11 in the second direction Dr2. In the second direction Dr2, a third portion W11c of the first-layer first-row second conductive layer W11 is disposed between the second-layer second-row contact CT22 and the first-layer first-row contact CT11.

A first length L1 of the first-layer first-row second conductive layer W11 along the second direction Dr2 is shorter than a second length L2 of the second-layer first-row second conductive layer W21 along the second direction Dr2.

The first-layer first-row first conductive layer B11 is e.g. a bit line BL. The first-layer first-row second conductive layer W11 is e.g. a word line WL. The first-layer first-row memory cell CE11 is provided between the first-layer first-row first conductive layer B11 and the first-layer first-row second conductive layer W11.

For instance, when a voltage VT is applied between the first-layer first-row first conductive layer B11 (bit line BL) and the first-layer first-row second conductive layer W11 (word line WL1), a current flows in the first-layer first-row memory cell CE11.

For instance, When a voltage VR lower than the voltage VT is applied between the first-layer first-row first conductive layer B11 (bit line BL) and the first-layer first-row second conductive layer W11 (word line WL1), a current is harder to flow in the first-layer first-row memory cell CE11. In the first-layer first-row memory cell CE11, the magnitude of the current changes in response to the applied voltage.

A thickness t2 of the second-layer first-row second conductive layer W21 along the third direction Dr3 is larger than a thickness t1 of the first-layer first-row second conductive layer W11 along the third direction Dr3.

The first-layer first-row second conductive layer W11 includes a first portion W11a, a second portion W11b, and the third portion W11c provided between the first portion W11a and the second portion W11b. The third portion W11c is connected to the first-layer first-row contact CT11.

A first distance D1 of the first portion W11a along the second direction Dr2 is nearly equal to a second distance D2 of the second portion W11b along the second direction Dr2. The first distance D1 is e.g. 0.8 to 1.2 times the second distance D2.

The semiconductor memory device 110 according to the embodiment further includes a first-layer third-row first conductive layer B13, a first-layer fourth-row first conductive layer B14, a first-layer third-row memory cell CE13, a first-layer fourth-row memory cell CE14, a first-layer third-row second conductive layer W13, a first-layer third-row contact CT13, a second-layer third-row intermediate memory cell MC23, a second-layer third-row first conductive layer B23, and a second-layer third-row memory cell CE23.

The first-layer fourth-row first conductive layer B14 is separated from the first-layer second-row first conductive layer B12 in the second direction Dr2 and extends in the first direction Dr1. The first-layer third-row first conductive layer B13 is provided between the first-layer fourth-row first conductive layer B14 and the second-layer second-row contact CT22 and extends in the first direction Dr1.

The first-layer third-row second conductive layer W13 is separated from the first-layer third-row first conductive layer B13 and the first-layer fourth-row first conductive layer B14 in the third direction Dr3, separated from the first-layer first-row second conductive layer W11 in the second direction Dr2, and extends in the second direction Dr2.

The first-layer third-row memory cell CE13 is provided between the first-layer third-row second conductive layer W13 and the first-layer third-row first conductive layer B13. The first-layer fourth-row memory cell CE14 is provided between the first-layer third-row second conductive layer W13 and the first-layer fourth-row first conductive layer B14.

The first-layer third-row contact CT13 is connected to the first-layer third-row second conductive layer W13. The first-layer third-row contact CT13 extends in the third direction Dr3 between the first-layer third-row first conductive layer B13 and the first-layer fourth-row first conductive layer B14.

The second-layer third-row intermediate memory cell MC23 is provided between the first-layer third-row second conductive layer W13 and the second-layer first-row second conductive layer W21. The second-layer third-row first conductive layer B23 is provided between the second-layer third-row intermediate memory cell MC23 and the second-layer first-row second conductive layer W21 and extends in the first direction. The second-layer third-row memory cell CE23 is provided between the second-layer third-row first conductive layer B23 and the second-layer first-row second conductive layer W21.

The second-layer second-row contact CT22 is disposed between the first-layer first-row second conductive layer W11 and the first-layer third-row second conductive layer W13. The second-layer second-row contact CT22 is disposed between the second-layer first-row intermediate memory cell MC21 and the second-layer third-row intermediate memory cell MC23. The second-layer second-row contact CT22 is disposed between the second-layer first-row first conductive layer B21 and the second-layer third-row first conductive layer B23. The second-layer second-row contact CT22 is disposed between the second-layer first-row memory cell CE21 and the second-layer third-row memory cell CE23.

The second-layer first-row second conductive layer W21 includes a fourth portion W21$d$, a fifth portion W21$e$, and a sixth portion W21$f$ provided between the fourth portion W21$d$ and the fifth portion W21$e$. The sixth portion W21$f$ is connected to the second-layer second-row contact CT22.

A fourth distance D4 of the fourth portion W21$d$ along the second direction Dr2 is nearly equal to a fifth distance D5 of the fifth portion W21$e$ along the second direction Dr2. The fourth distance D4 is e.g. 0.8 to 1.2 times the fifth distance D5.

The semiconductor memory device 110 according to the embodiment further includes a first transistor TR1, a second transistor TR2, and a third transistor TR3. The first transistor TR1 is electrically connected to the first-layer first-row contact CT11. The second transistor TR2 is electrically connected to the second-layer second-row contact CT22.

The third transistor TR3 is electrically connected to the first-layer third-row contact CT13.

As described above, the semiconductor memory device 110 according to the embodiment includes a plurality of the first blocks BK1, a plurality of the second blocks BK2, the third block BK3, and the fourth block BK4. The plurality of first blocks BK1 are arranged in the second direction Dr2. The plurality of second blocks BK2 are arranged in the second direction Dr2.

One of the plurality of first blocks BK1 includes e.g. the first-layer first-row first conductive layer B11, the first-layer second-row first conductive layer B12, the first-layer first-row memory cell CE11, the first-layer second-row memory cell CE12, the first-layer first-row second conductive layer W11, and the first-layer first-row contact CT11.

One of the plurality of second blocks BK2 includes e.g. the second-layer first-row intermediate memory cell MC21, the second-layer first-row first conductive layer B21, the second-layer first-row memory cell CE21, the second-layer first-row second conductive layer W21, the second-layer second-row contact CT22, the second-layer third-row intermediate memory cell MC23, the second-layer third-row first conductive layer B23, and the second-layer third-row memory cell CE23.

In the embodiment, for instance, when a 1000 bit lines respectively extend in the first direction Dr1 and are arranged in the second direction Dr2, the 1000 bit lines are divided in five regions. One region includes 200 bit lines. The distance between the 200th bit line and the 201st bit line is larger than the distance between the first bit line and the second bit line. The contact is provided between the 200th bit line and the 201st bit line.

In a cross-point memory such as ReRAM (Resistance Random Access Memory), as the number of memory cells is larger, the lengths of the bit lines and the word lines are larger. When voltages are applied from the transistors to the bit lines and the word lines, if the lengths of the bit lines and the word lines are larger, the voltages applied to the memory cells become non-constant due to reduction of the voltages. Thereby, fluctuations of the voltages applied to the memory cells may be larger.

In this regard, in the semiconductor memory device 110 according to the embodiment, the first length L1 of the first-layer first-row second conductive layer W11 along the second direction Dr2 is shorter than the second length L2 of the second-layer first-row second conductive layer W21 along the second direction Dr2.

When a voltage is applied between the first-layer first-row first conductive layer B11 and and the first-layer first-row second conductive layer W11, the reduction of the voltage is small. Thereby, for instance, the voltages applied to the memory cells (CE11, CE12) in a first layer 1L are more equalized than the voltages applied to the memory cells (CE21, CE22, CE23, CE24) in a second layer 2L. That is, the fluctuations of the voltages applied to the memory cells become smaller.

As a result, it is possible to provide a semiconductor memory device that can improve operation stability.

In the semiconductor memory device 110 according to the embodiment, a layer including the first-layer first-row second conductive layer W11, the first-layer third-row second conductive layer W13, the first-layer first-row contact CT11, and the first-layer third-row contact CT13 is e.g. the first layer 1L. A layer including the second-layer first-row second conductive layer W21 and the second-layer second-row contact CT22 is e.g. the second layer 2L.

The first-layer first-row second conductive layer W11 and the first transistor TR1 are electrically connected, and the first-layer third-row second conductive layer W13 and the third transistor TR3 are electrically connected. The second-layer first-row second conductive layer W21 and the second transistor TR2 are electrically connected.

The number of transistors electrically connected to the second layer 2L is smaller than the number of transistors electrically connected to the first layer 1L. For instance, the number of transistors electrically connected to the second layer 2L is a half of the number of transistors electrically connected to the first layer 1L. Thereby, it is possible to secure operation stability in the upper layers farther from the substrate in which the operation is likely to be unstable. Since the number of transistors is smaller, power consumption may be lower. Further, the device is miniaturized.

The third layer (third block BK3) and the fourth layer (fourth block BK4) have e.g. the same configurations as the above described first layer (first block BK1) and the second layer (second block BK2).

Figure 2A:
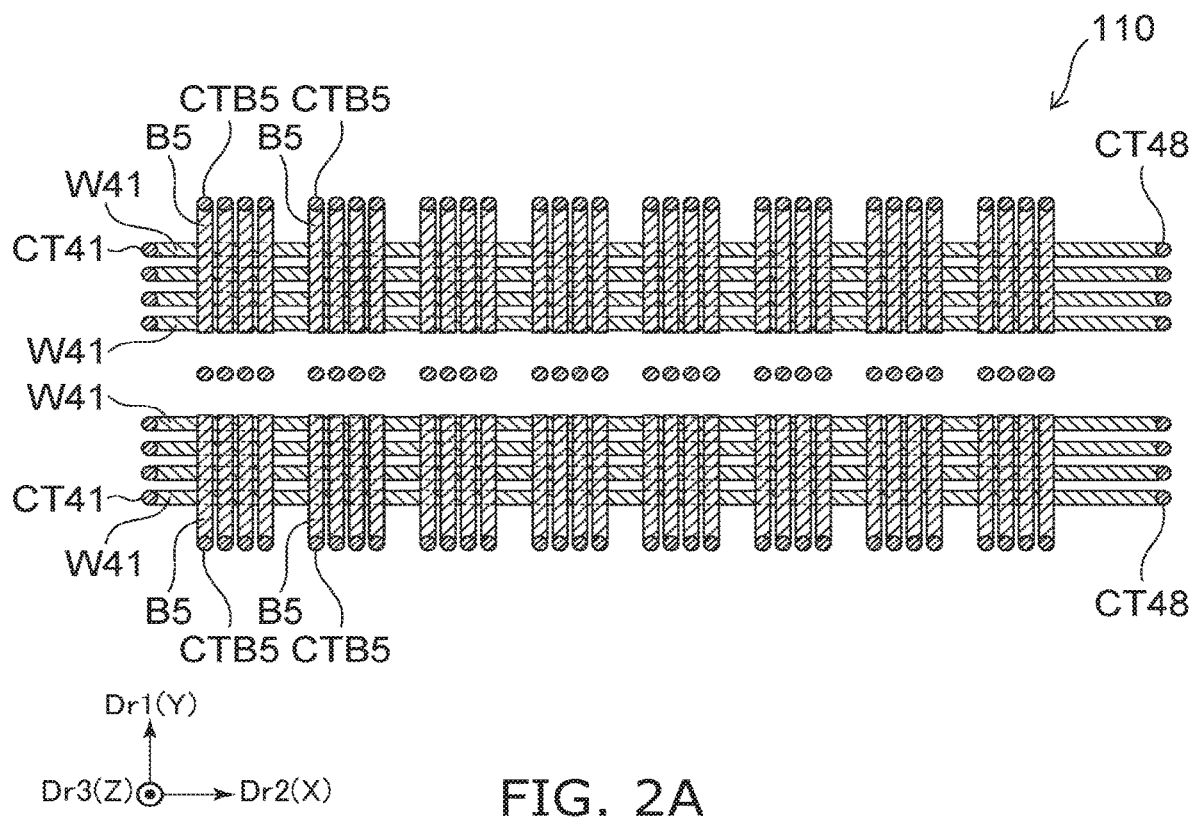
FIG. 2A is a schematic sectional view illustrating the semiconductor memory device according to the embodiment.

FIG. 2A is a schematic sectional view illustrating the semiconductor memory device according to the embodiment.

FIG. 2A is the schematic sectional view along line C1-C2 in FIG. 1A.

As shown in FIG. 2A, the semiconductor memory device 110 according to the embodiment further includes a plurality of fifth-layer first conductive layers B5, a plurality of fourth-layer first-row second conductive layers W41, a plurality of fourth-layer first-row contacts CT41, a plurality of fourth-layer eighth-row contacts CT48, and a plurality of fifth-layer contacts CTB5. The respective fifth-layer first conductive layers B5 and the respective fourth-layer first-row second conductive layers W41 cross.

One end of each fourth-layer first-row second conductive layer W41 is connected to one of the plurality of fourth-layer first-row contacts CT41. The other end of each fourth-layer first-row second conductive layer W41 is connected to one of the plurality of fourth-layer eighth-row contacts CT48. One end of each fifth-layer first conductive layer B5 is connected to one of the plurality of fifth-layer contacts CTB5.

The respective plurality of fifth-layer first conductive layers B5 extend in the first direction Dr1. The respective plurality of fourth-layer first-row second conductive layers W41 extend in the second direction Dr2. The respective plurality of fifth-layer contacts CTB5 extend in the third direction Dr3. The respective plurality of fourth-layer eighth-row contacts CT48 extend in the third direction Dr3.

Figure 2B:
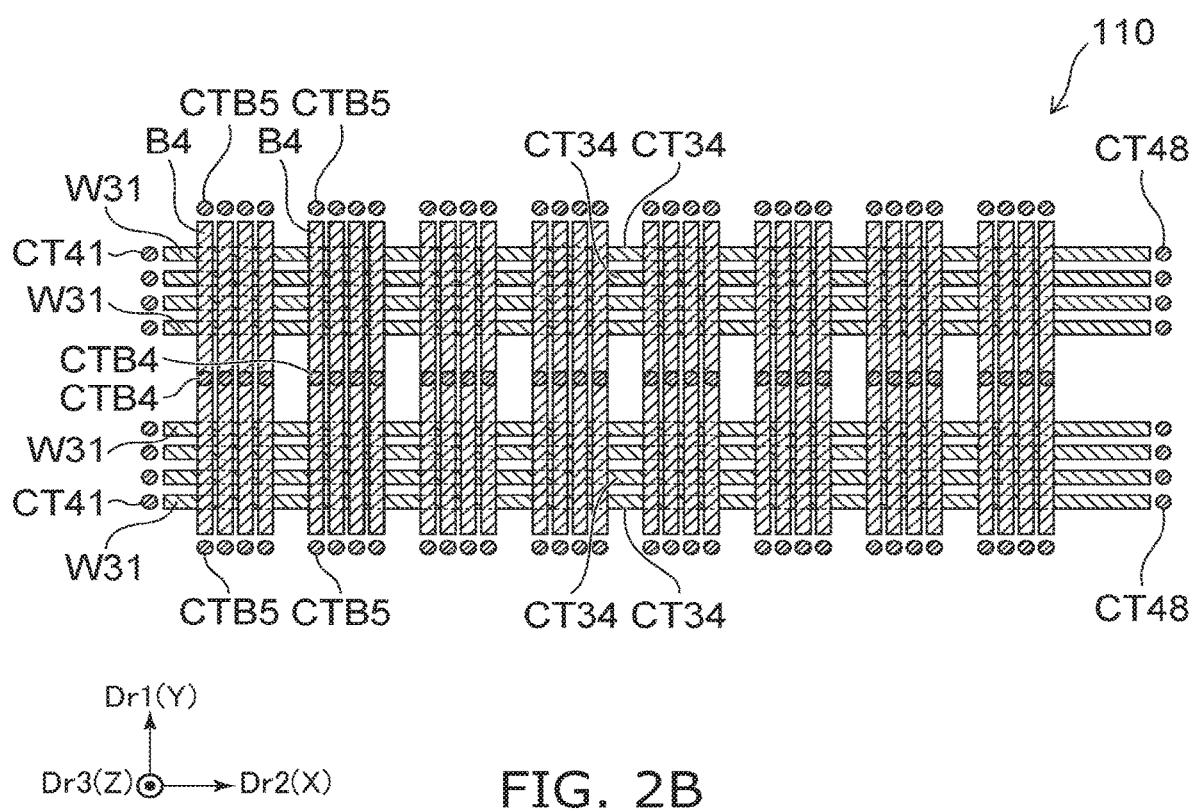
FIG. 2B is a schematic sectional view illustrating the semiconductor memory device according to the embodiment.

FIG. 2B is a schematic sectional view illustrating the semiconductor memory device according to the embodiment.

FIG. 2B is the schematic sectional view along line F1-F2 in FIG. 1A.

As shown in FIG. 2B, the semiconductor memory device 110 according to the embodiment further includes a plurality of fourth-layer first conductive layers B4, a plurality of third-layer first-row second conductive layers W31, a plurality of fourth-layer contacts CTB4, and a plurality of third-layer fourth-row contacts CT34. The respective fourth-layer first conductive layers B4 and the respective third-layer first-row second conductive layers W31 cross.

One of the plurality of third-layer first-row second conductive layers W31 and one of the plurality of third-layer fourth-row contacts CT34 are connected. One of the plurality of fourth-layer first conductive layers B4 and one of the plurality of fourth-layer contacts CTB4 are connected.

The respective plurality of fourth-layer first conductive layers B4 extend in the first direction Dr1. The respective plurality of third-layer first-row second conductive layers W31 extend in the second direction Dr2. The respective plurality of fourth-layer contacts CTB4 extend in the third direction Dr3. The respective plurality of third-layer fourth-row contacts CT34 extend in the third direction Dr3.

Figure 3A:
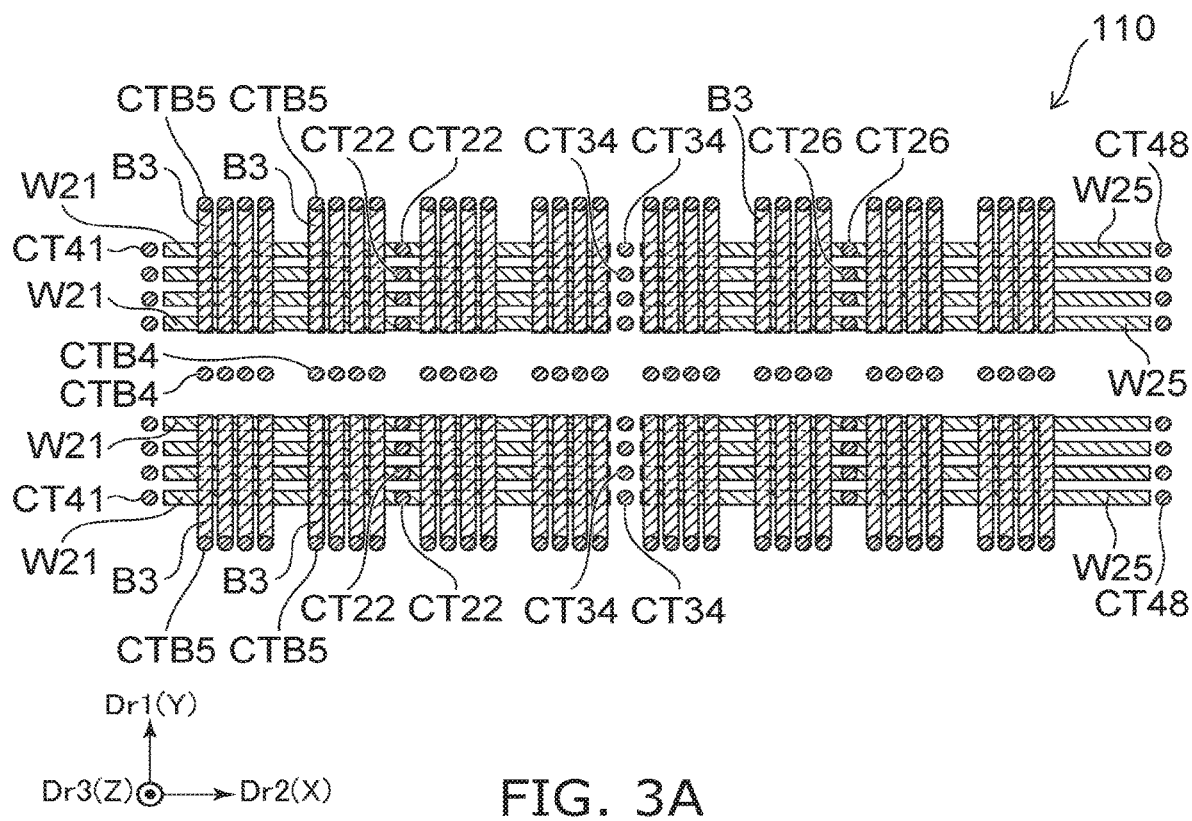
FIG. 3A is a schematic sectional view illustrating the semiconductor memory device according to the embodiment.

FIG. 3A is a schematic sectional view illustrating the semiconductor memory device according to the embodiment.

FIG. 3A is the schematic sectional view along line G1-G2 in FIG. 1A.

As shown in FIG. 3A, the semiconductor memory device 110 according to the embodiment further includes a plurality of third-layer first conductive layers B3, a plurality of second-layer first-row second conductive layers W21, and a plurality of second-layer second-row contacts CT22. The respective third-layer first conductive layers B3 and the respective second-layer first-row second conductive layers W21 cross.

One of the plurality of second-layer first-row second conductive layers W21 and one of the second-layer second-row contacts CT22 are connected. One end of each of the respective third-layer first conductive layers B3 is connected to one of the plurality of fifth-layer contacts CTB5.

The respective plurality of third-layer first conductive layers B3 extend in the first direction Dr1. The respective plurality of second-layer first-row second conductive layers W21 extend in the second direction Dr2. The respective plurality of second-layer second-row contacts CT22 extend in the third direction Dr3.

The semiconductor memory device 110 according to the embodiment further includes a plurality of second-layer fifth-row second conductive layers W25 and a plurality of second-layer sixth-row contacts CT26. The respective third-layer first conductive layers B3 and the respective second-layer fifth-row second conductive layers W25 cross.

One of the plurality of second-layer fifth-row second conductive layers W25 and one of the plurality of second-layer sixth-row contacts CT26 are connected.

The respective plurality of second-layer fifth-row second conductive layers W25 extend in the second direction Dr2. The respective plurality of second-layer sixth-row contacts CT26 extend in the third direction Dr3.

Figure 3B:
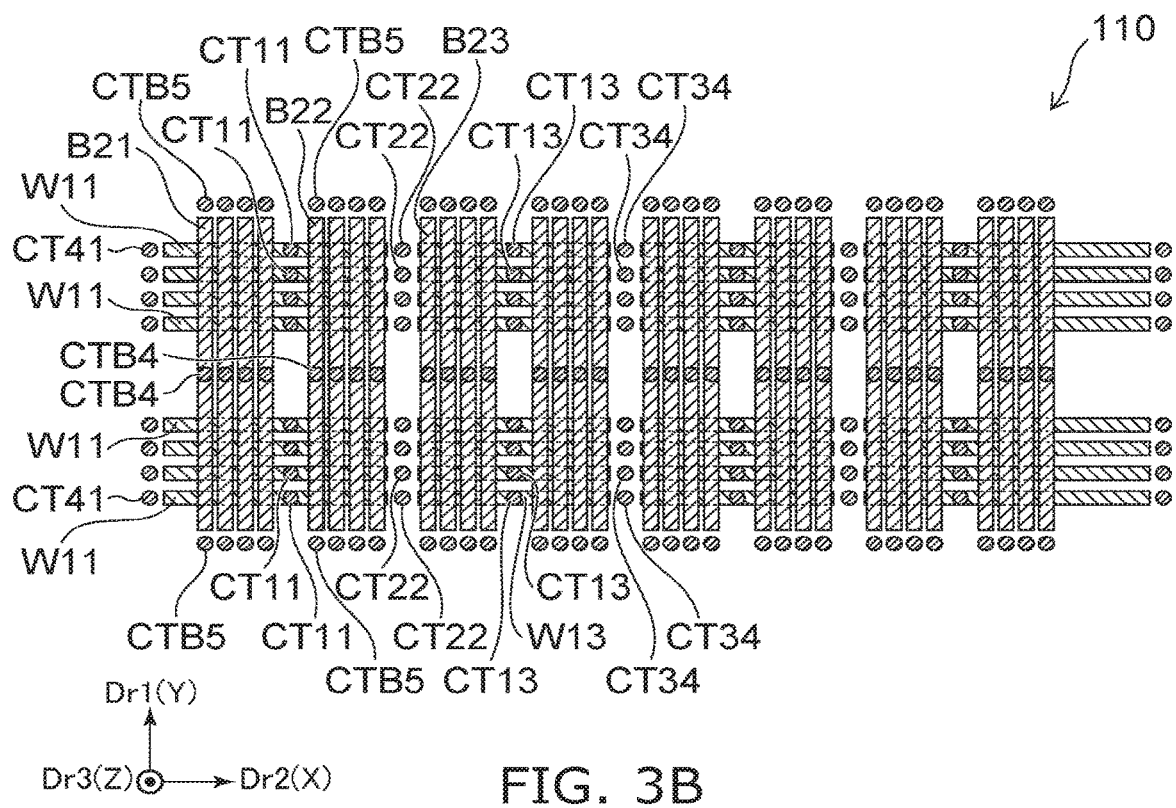
FIG. 3B is a schematic sectional view illustrating the semiconductor memory device according to the embodiment.

FIG. 3B is a schematic sectional view illustrating the semiconductor memory device according to the embodiment.

FIG. 3B is the schematic sectional view along line H1-H2 in FIG. 1A.

As shown in FIG. 3B, the semiconductor memory device 110 according to the embodiment further includes a plurality of second-layer first-row first conductive layers B21, a plurality of second-layer second-row first conductive layers B22, a plurality of first-layer first-row second conductive layers W11, and a plurality of first-layer first-row contacts CT11.

The respective second-layer first-row first conductive layers B21 and the respective first-layer first-row second conductive layers W11 cross. The respective second-layer second-row first conductive layers B22 and the respective first-layer first-row second conductive layers W11 cross. One of the plurality of first-layer first-row second conductive layers and one of the plurality of first-layer first-row contacts CT11 are connected. One of the plurality of second-layer first-row first conductive layers B21 and one of the plurality of fourth-layer contacts CTB4 are connected.

The respective plurality of second-layer first-row first conductive layers B21 extend in the first direction Dr1. The respective plurality of second-layer second-row first conductive layers B22 extend in the first direction Dr1. The respective plurality of first-layer first-row second conductive layers W11 extend in the second direction Dr2. The respective plurality of first-layer first-row contacts CT11 extend in the third direction Dr3.

The semiconductor memory device 110 according to the embodiment further includes a plurality of second-layer third-row first conductive layers B23, a plurality of second-layer fourth-row first conductive layers B24, a plurality of first-layer third-row second conductive layers W13, and a plurality of first-layer third-row contacts CT13.

The respective second-layer third-row first conductive layers B23 and the respective first-layer third-row second conductive layers W13 cross. The respective second-layer fourth-row first conductive layers B24 and the respective first-layer third-row second conductive layers W13 cross. One of the plurality of first-layer third-row second conductive layers W13 and one of the plurality of first-layer third-row contacts CT13 are connected. One of the plurality of second-layer third-row first conductive layers B23 and one of the plurality of fourth-layer contacts CTB4 are connected.

The respective plurality of second-layer third-row first conductive layers B23 extend in the first direction Dr1. The respective plurality of second-layer fourth-row first conductive layers B24 extend in the first direction Dr1. The respective plurality of first-layer third-row second conductive layers W13 extend in the second direction Dr2. The respective plurality of first-layer third-row contacts CT13 extend in the third direction Dr3.

Figure 4:
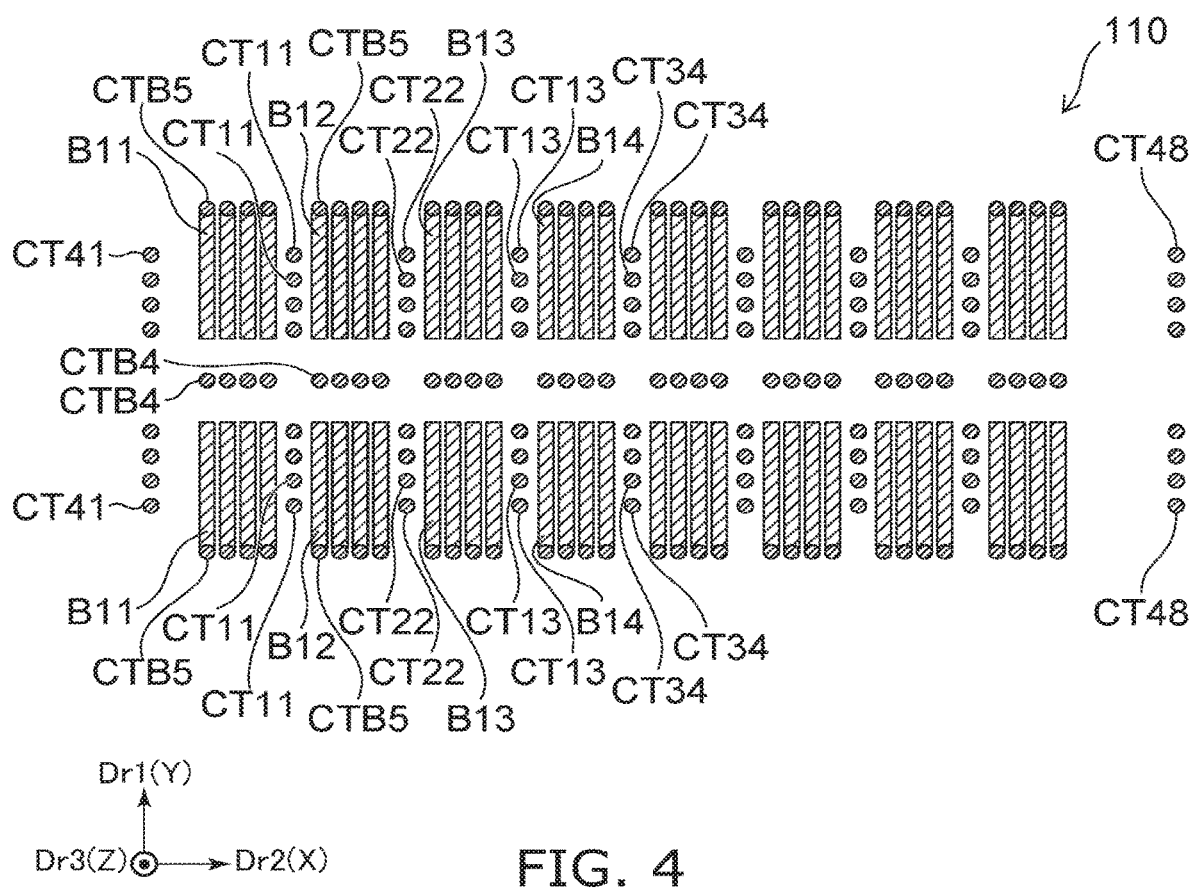
FIG. 4 is a schematic sectional view illustrating the semiconductor memory device according to the embodiment.

FIG. 4 is a schematic sectional view illustrating the semiconductor memory device according to the embodiment.

FIG. 4 is the schematic sectional view along line 31-32 in FIG. 1A.

As shown in FIG. 4, the semiconductor memory device 110 according to the embodiment further includes a plurality of first-layer first-row first conductive layers B11, a plurality of first-layer first-row second conductive layers B12, a plurality of first-layer third-row first conductive layers B13, and a plurality of first-layer first-row fourth conductive layers B14.

The respective pluralities of first-layer first-row to fourth-row first conductive layers B11 to B14 extend in the first direction Dr1.

Figure 5:
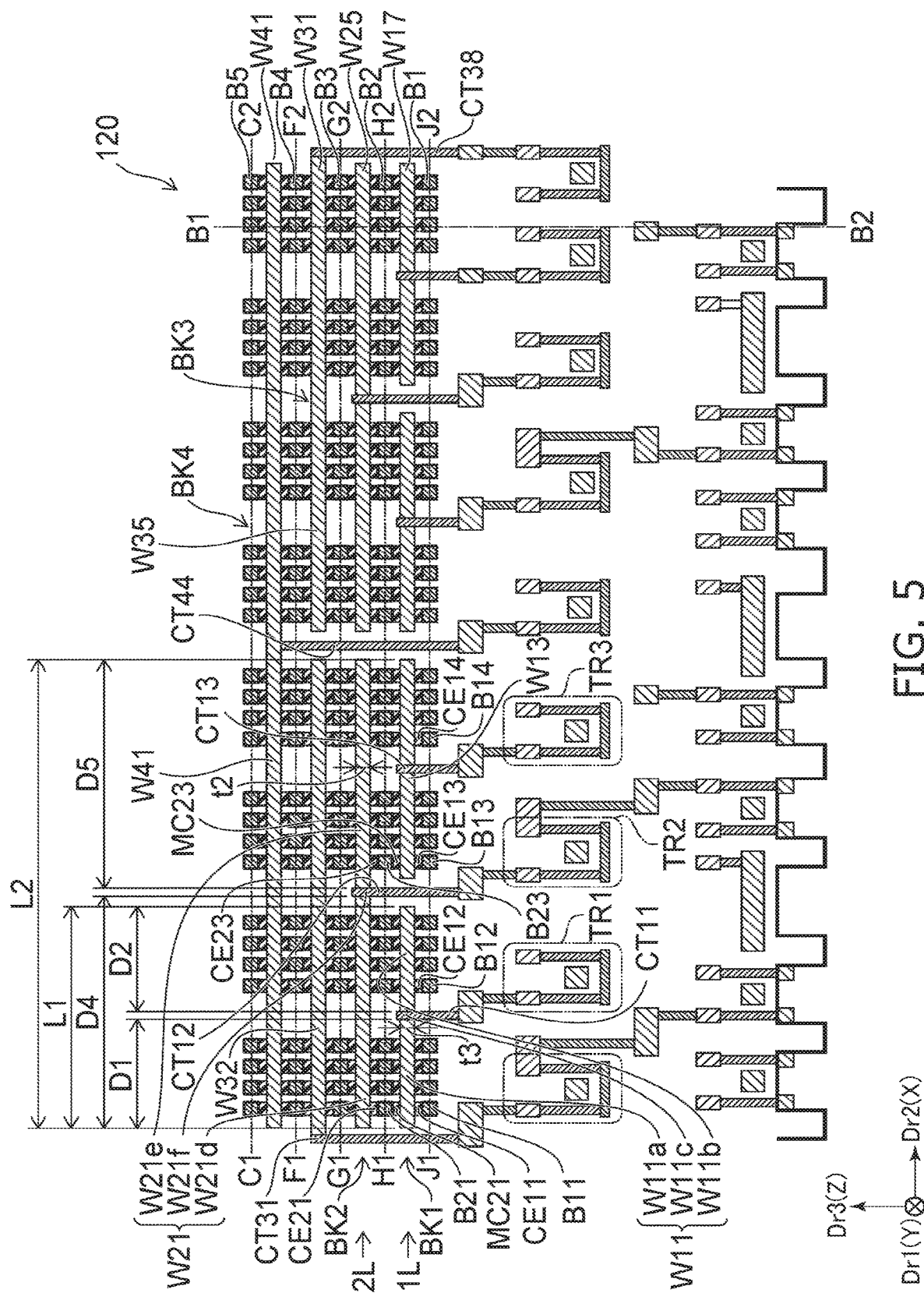
FIG. 5 is a schematic sectional view of another example of the semiconductor memory device according to the embodiment.

FIG. 5 is a schematic sectional view of another example of the semiconductor memory device according to the embodiment.

As shown in FIG. 5, in a semiconductor memory device 120 according to the embodiment, a plurality of third-layer first-row contacts CT31 are provided in place of the plurality of fourth-layer first-row contacts CT41. A plurality of third-layer eighth-row contacts CT38 are provided in place of the plurality of fourth-layer eighth-row contacts CT48. A plurality of fourth-layer fourth-row contacts CT44 are provided in place of the plurality of third-layer fourth-row contacts CT34. A plurality of third-layer second-row second conductive layers W32 and a plurality of third-layer fifth-row second conductive layers W35 are provided in place of the plurality of third-layer first-row second conductive layers W31.

The respective plurality of third-layer fifth-row second conductive layers W35 are arranged with the respective plurality of third-layer second-row second conductive layers W32 in the second direction Dr2. One of the plurality of fourth-layer fourth-row contacts CT44 is provided between one of the plurality of third-layer second-row second conductive layers W32 and one of the plurality of third-layer fifth-row second conductive layers W35. One of the plurality of fourth-layer first-row second conductive layers W41 and one of the plurality of fourth-layer fourth-row contacts CT44 are connected. One end of one of the plurality of third-layer second-row second conductive layers W32 and one of the plurality of third-layer first-row contacts CT31 are connected. One end of one of the plurality of third-layer fifth-row second conductive layers W35 and one of the plurality of third-layer eighth-row contacts CT38 are connected.

The fourth-layer first-row second conductive layers W41, the third-layer second-row second conductive layers W32, and the third-layer fifth-row second conductive layers W35 are e.g. word lines. The word line with one end connected to the contact is not necessarily the word line in the uppermost layer, e.g., W41 shown in FIG. 5. One end of the word line in the second layer from the top e.g. the third-layer second-row second conductive layer W32 and the contact may be connected. For instance, one end of the third-layer fifth-row second conductive layer W35 and the contact may be connected.

According to the embodiment, it is possible to provide a semiconductor memory device capable of improving operation stability.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
    a substrate comprising a surface to which a plurality of trenches are formed, the plurality of trenches including a first trench and a second trench;
    a plurality of first wirings extending in a first direction, the plurality of first wirings being arranged in a second direction crossing the first direction;
    a plurality of second wirings being provided between the substrate and the plurality of first wirings, the plurality of second wirings being adjacent to the plurality of first wirings in a third direction crossing the first and second direction and perpendicular to the surface of the substrate, the plurality of second wirings extending in the first direction, the plurality of second wirings being arranged in the second direction;
    a plurality of third wirings being provided between the plurality of first wirings and the second wirings in the third direction, the plurality of third wirings extending in the second direction, the plurality of third wirings being arranged in the first direction;

a first resistance changeable layer being provided between one of the plurality of first wirings and one of the plurality of third wirings;
a second resistance changeable layer being provided between one of the plurality of second wirings and one of the plurality of third wirings;
a first memory cell array including the first resistance changeable layer and the second resistance changeable layer;
a plurality of fourth wirings being provided between the substrate and the plurality of first wirings, the plurality of fourth wirings being adjacent to the plurality of first wirings in the third direction, the plurality of fourth wirings extending in the first direction and being arranged in the second direction, the plurality of fourth wirings being adjacent to the plurality of second wirings in the first direction;
a plurality of fifth wirings being provided between the plurality of first wirings and the plurality of fourth wirings in the third direction, the plurality of fifth wirings extending in the second direction and being arranged in the first direction;
a third resistance changeable layer being provided between one of the plurality of first wirings and one of the plurality of fifth wirings;
a fourth resistance changeable layer being provided between one of the plurality of fourth wirings and one of the plurality of fifth wirings;
a second memory cell array including the third resistance changeable layer and the fourth resistance changeable layer;
a first contact being electrically connected to one of the first wirings, being provided between the first memory cell array and the second memory cell array in the first direction, and extending in the third direction;
a second contact being electrically connected to one of the second wirings, the second contact being shorter than the first contact in the third direction, and extending in the third direction;
a third contact being electrically connected to one of the fourth wirings, the third contact being shorter than the first contact in the third direction, and extending in the third direction;
a first circuit element being electrically connected to the first contact, the first circuit element being provided between the first trench and the second trench; and
a second circuit element being electrically connected to the second contact; and
a third circuit element being electrically connected to the third contact.

2. The device according to claim 1, further comprising:
at least four metal layers being provided between the first and second memory cell arrays and the substrate.

3. The device according to claim 1, further comprising:
a first layer being provided between the first contact and the substrate in the third direction, including a plurality of sixth wirings extending in the first or the second directions;
a second layer being provided between the first contact and the first layer in the third direction, including a plurality of seventh wirings extending in the first or the second directions;
a third layer being provided between the first contact and the second layer in the third direction, including a plurality of eighth wirings extending in the first or the second directions; and
a fourth layer being provided between the first contact and the third layer in the third direction, including a plurality of ninth wirings extending in the first or the second directions.

4. The device according to claim 1, wherein the second circuit element is provided below the first memory cell array, and
the third circuit element is provided below the second memory cell array.

5. The device according to claim 1, wherein the second circuit element and the third circuit element are provided on the substrate.

6. The device according to claim 1, further comprising:
a tenth wiring being provided between the substrate and the first contact;
an eleventh wiring being provided between the tenth wiring and the first contact;
a twelfth wiring being provided between the eleventh wiring and the first contact; and
a thirteenth wiring being provided between the twelfth wiring and the first contact.

7. The device according to claim 6, further comprising:
a fourth contact being electrically connected to the tenth wiring and the eleventh wiring;
a fifth contact being electrically connected to the eleventh wiring and the twelfth wiring; and
a sixth contact being electrically connected to the twelfth wiring and the thirteenth wiring.

8. The device according to claim 1, wherein the first, second, and third circuit elements are transistors.

9. The device according to claim 1, wherein the first memory cell array is adjacent to the second memory cell array in the first direction.

10. The device according to claim 1, further comprising:
a plurality of fourteenth wirings being provided above the first wiring in the third direction, each of the fourteenth wirings being arranged to the first direction, the fourteenth wirings extending in the second direction.

11. A memory device comprising:
a substrate comprising a surface to which a plurality of trenches are formed, the plurality of trenches including a first trench and a second trench;
a plurality of first wirings extending in a first direction, the plurality of first wirings being arranged in a second direction crossing the first direction;
a plurality of second wirings being provided between the substrate and the plurality of first wirings, the plurality of second wirings being adjacent to the plurality of first wirings in a third direction crossing the first and second direction and perpendicular to the surface of the substrate, the plurality of second wirings extending in the first direction, the plurality of second wirings being arranged in the second direction;
a plurality of third wirings being provided between the plurality of first wirings and the second wirings in the third direction, the plurality of third wirings extending in the second direction and being arranged in the first direction;
a plurality of first resistance changeable layers being provided between the plurality of first wirings and the plurality of third wirings;
a plurality of second resistance changeable layers being provided between the plurality of second wirings and the plurality of third wirings;
a first memory cell array including the plurality of the first resistance changeable layers and the plurality of second resistance changeable layers;

a plurality of fourth wirings being provided between the substrate and the plurality of first wirings, the plurality of fourth wirings being adjacent to the plurality of first wirings in the third direction, the plurality of fourth wirings extending in the first direction and being arranged in the second direction, the plurality of fourth wirings being adjacent to the plurality of second wirings in the first direction;

a plurality of the fifth wirings being provided between the plurality of first wirings and the plurality of fourth wirings in the third direction, the plurality of fifth wirings extending in the second direction and being arranged in the first direction;

a plurality of third resistance changeable layers being provided between the plurality of first wirings and the plurality of fifth wirings;

a plurality of fourth resistance changeable layers being provided between the plurality of fourth wirings and the plurality of fifth wirings;

a second memory cell array including the plurality of third resistance changeable layers and the plurality of fourth resistance changeable layers;

a first contact being electrically connected to one of the first wirings, being provided between the first memory cell array and the second memory cell array in the first direction, and extending in the third direction;

a second contact being electrically connected to one of the second wirings, the second contact being shorter than the first contact in the third direction, and extending in the third direction;

a third contact being electrically connected to one of the fourth wirings, the third contact being shorter than the first contact in the third direction, and extending in the third direction;

a first circuit element being electrically connected to the second contact, the first circuit element being provided between the first trench and the second trench; and a second circuit element being provided below the second memory cell array.

12. The device according to claim 11, further comprising:
at least four metal layers formed between the first and second memory cell arrays and the substrate.

13. The device according to claim 11, further comprising:
a first layer being provided between the first contact and the substrate in the third direction, including a plurality of sixth wirings extending in the first or the second directions;
a second layer being provided between the first contact and the first layer in the third direction, including a plurality of seventh wirings extending in the first or the second directions;
a third layer being provided between the first contact and the second layer in the third direction, including a plurality of eighth wirings extending in the first or the second directions; and
a fourth layer being provided between the first contact and the third layer in the third direction, including a plurality of ninth wirings extending in the first or the second directions.

14. The device according to claim 11, wherein the first circuit element is provided below the first memory cell array.

15. The device according to claim 11, further comprising:
a third circuit element being electrically connected to the first contact.

16. The device according to claim 11, wherein the first circuit element is provided on the substrate.

17. The device according to claim 11, further comprising:
a tenth wiring being provided between the substrate and the first contact;
an eleventh wiring being provided between the sixth wiring and the first contact;
a twelfth wiring being provided between the seventh wiring and the first contact; and
a thirteenth wiring being provided between the eighth wiring and the first contact.

18. The device according to claim 15, wherein the first, second and third circuit elements are transistors.

19. The device according to claim 11, wherein the first memory cell array is adjacent to the second memory cell array in the first direction.

20. The device according to claim 1, further comprising:
a plurality of fourteenth wirings being provided above the first wiring in the third direction, each of the fourteenth wirings being arranged to the first direction, the fourteenth wirings extending in the second direction.

21. A memory device comprising:
a substrate;
a plurality of first wirings extending in a first direction, the plurality of first wirings being arranged in a second direction crossing the first direction;
a plurality of second wirings being provided between the substrate and the plurality of first wirings, the plurality of second wirings being adjacent to the plurality of first wirings in a third direction crossing the first and second direction and perpendicular to a surface of the substrate, the plurality of second wirings extending in the first direction, the plurality of second wirings being arranged in the second direction;
a plurality of third wirings being provided between the plurality of first wirings and the second wirings in the third direction, the plurality of third wirings extending in the second direction and being arranged in the first direction;
a plurality of first resistance changeable layers being provided between the plurality of first wirings and the plurality of third wirings;
a plurality of second resistance changeable layers being provided between the plurality of second wirings and the plurality of third wirings;
a first memory cell array including the plurality of the first resistance changeable layers and the plurality of second resistance changeable layers;
a plurality of fourth wirings being provided between the substrate and the plurality of first wirings, the plurality of fourth wirings being adjacent to the plurality of first wirings in the third direction, the plurality of fourth wirings extending in the first direction and being arranged in the second direction, the plurality of fourth wirings being adjacent to the plurality of second wirings in the first direction;
a plurality of the fifth wirings being provided between the plurality of first wirings and the plurality of fourth wirings in the third direction, the plurality of fifth wirings extending in the second direction and being arranged in the first direction;
a plurality of third resistance changeable layers being provided between the plurality of first wirings and the plurality of fifth wirings;
a plurality of fourth resistance changeable layers being provided between the plurality of fourth wirings and the plurality of fifth wirings;
a second memory cell array including the plurality of third resistance changeable layers and the plurality of fourth resistance changeable layers;

a first contact being electrically connected to one of the first wirings, being provided between the first memory cell array and the second memory cell array in the first direction, and extending in the third direction;

a second contact being electrically connected to one of the second wirings, the second contact being shorter than the first contact in the third direction, and extending in the third direction;

a third contact being electrically connected to one of the fourth wirings, the third contact being shorter than the first contact in the third direction, and extending in the third direction;

a first circuit element being electrically connected to the second contact; and a second circuit element being electrically connected to the third contact.

22. The device according to claim 21, wherein
the first circuit element is provided below the first memory cell array, and
the second circuit element is provided below the second memory cell array.

23. The device according to claim 21, wherein the first circuit element and the second circuit element are provided on the substrate.

24. The device according to claim 21, further comprising:
a wiring being provided between the first circuit element and the first memory cell array, and
another wiring being provided between the second circuit element and the second memory cell array.

25. The device according to claim 21, further comprising:
a third circuit element being electrically connected to the first contact.

26. The device according to claim 21, wherein the first and second circuit elements are transistors.

27. The device according to claim 25, wherein the third circuit element is a transistor.

28. The device according to claim 21, wherein the first memory cell array is adjacent to the second memory cell array in the first direction.

29. The device according to claim 21, further comprising:
a plurality of sixth wirings being provided above the first wiring in the third direction, each of the six wirings being arranged to the first direction, the sixth wirings extending in the second direction.

30. A memory device comprising:
a substrate;
a first wiring extending in a first direction;
a second wiring being provided between the substrate and the first wiring, the second wiring being adjacent to the first wiring in a second direction perpendicular to a surface of the substrate, the second wiring extending in the first direction;
a third wiring being provided between the first wiring and the second wiring in the second direction, the third wiring extending in a third direction crossing the first and second direction;
a first resistance changeable layer being provided between the first wiring and the third wiring;
a second resistance changeable layer being provided between the second wiring and the third wiring;

a first memory cell array including the first resistance changeable layer and the second resistance changeable layer;

a fourth wiring being provided between the substrate and the first wiring, the fourth wiring being adjacent to the first wiring in the second direction, the fourth wiring extending in the first direction, the fourth wiring being adjacent to the second wiring in the first direction;

a fifth wiring being provided between the first wiring and the fourth wiring in the second direction, the fifth wiring extending in the third direction;

a third resistance changeable layer being provided between the first wiring and the fifth wiring;

a fourth resistance changeable layer being provided between the fourth wiring and the fifth wiring;

a second memory cell array including the third resistance changeable layer and the fourth resistance changeable layer;

a first contact being electrically connected to the first wiring, the first contact being provided between the first memory cell array and the second memory cell array, and extending in the second direction;

a second contact being electrically connected to the second wiring, the second contact being shorter than the first contact in the second direction, and extending in the second direction;

a third contact being electrically connected to the fourth wiring, the third contact being shorter than the first contact in the second direction, and extending in the second direction;

a first circuit element being electrically connected to the second contact; and a second circuit element being electrically connected to the third contact.

31. The device according to claim 30, wherein
the first circuit element is provided below the first memory cell array, and
the second circuit element is provided below the second memory cell array.

32. The device according to claim 30, wherein the first circuit element and the second circuit element are provided on the substrate.

33. The device according to claim 30, further comprising:
a wiring being provided between the first circuit element and the first memory cell array, and
another wiring being provided between the second circuit element and the second memory cell array.

34. The device according to claim 30, further comprising:
a third circuit element being electrically connected to the first contact.

35. The device according to claim 30, wherein the first and second circuit element are transistors.

36. The device according to claim 34, wherein the third circuit element is a transistor.

37. The device according to claim 30, wherein the first memory cell array is adjacent to the second memory cell array in the first direction.

38. The device according to claim 30, further comprising:
a sixth wiring being provided above the first wiring in the second direction, the sixth wiring extending in the third direction.

* * * * *